United States Patent
Yagi et al.

(10) Patent No.: US 9,252,371 B1
(45) Date of Patent: Feb. 2, 2016

(54) ORGANIC PHOTOELECTRONIC DEVICE AND IMAGE SENSOR AND ELECTRONIC DEVICE

(71) Applicant: Samsung Electronics Co., Ltd., Suwon-Si, Gyeonggi-Do (KR)

(72) Inventors: Tadao Yagi, Hwaseong-si (KR); Sakurai Rie, Suwon-si (KR); Kwang Hee Lee, Yongin-si (KR); Dong-Seok Leem, Hwaseong-si (KR); Xavier Bulliard, Seongnam-si (KR); Ryuichi Satoh, Numazu-si (JP); Kyung Bae Park, Hwaseong-si (KR); Sung Young Yun, Suwon-si (KR); Gae Hwang Lee, Seongnam-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/593,696

(22) Filed: Jan. 9, 2015

(30) Foreign Application Priority Data

Aug. 7, 2014 (KR) .................. 10-2014-0101908

(51) Int. Cl.
*H01L 51/00* (2006.01)
*H01L 51/44* (2006.01)
*H01L 27/30* (2006.01)

(52) U.S. Cl.
CPC ............ *H01L 51/008* (2013.01); *H01L 27/307* (2013.01); *H01L 51/442* (2013.01)

(58) Field of Classification Search
CPC .................. H01L 51/4253; H01L 51/0053
See application file for complete search history.

(56) References Cited

U.S. PATENT DOCUMENTS

| 7,973,307 B2 | 7/2011 | Rand et al. |
| 2010/0036134 A1* | 2/2010 | Mori ................ C09B 47/045 548/405 |
| 2012/0090685 A1 | 4/2012 | Forrest et al. |
| 2013/0112947 A1* | 5/2013 | Lee ................ H01L 51/0068 257/40 |

(Continued)

FOREIGN PATENT DOCUMENTS

| JP | 2011-140639 A | 7/2011 |
| WO | WO-9424612 A1 | 10/1994 |

OTHER PUBLICATIONS

Deng, Jeremy D et al . ".A Boron Subphthalocyanine Polymer: Poly(4-methylstyrene)-co-poly(phenoxy Boron Subphthalocyanine)." *Macromolecules* 45 (2012) pp. 7791-7798.

(Continued)

*Primary Examiner* — Jerome Jackson, Jr.
*Assistant Examiner* — Ankush Singal
(74) *Attorney, Agent, or Firm* — Harness, Dickey & Pierce, P.L.C.

(57) ABSTRACT

An organic photoelectronic device includes a first electrode and a second electrode facing each other, and an active layer between the first electrode and the second electrode and including a first compound represented by Chemical Formula 1 or 2, and a ratio between a FWHM of a light absorption curve depending on a wavelength of the first compound in a solution state and in a thin film state satisfies the following Relationship Equation 1: FWHM2/FWHM1<2.5. In the Relationship Equation 1, FWHM1 is a FWHM of the light absorption curve depending on a wavelength in a solution state, and FWHM2 is a FWHM of the light absorption curve depending on a wavelength in a thin film state.

17 Claims, 8 Drawing Sheets

(56) References Cited

U.S. PATENT DOCUMENTS

2014/0097416 A1* 4/2014 Lee ................ H01L 51/0069
257/40
2014/0117321 A1* 5/2014 Lim ..................... C07C 13/62
257/40

OTHER PUBLICATIONS

Fulford, Mabel V et al., "Crystal Structures, Reaction rates, and Selected Physical Properties of Halo-Boronsubphthalocyanines (Halo-Fluoride, Chloride, and Bromide" Journal of Chemical & Engineering Data 57 (2012) pp. 2756-2765.

Guilleme, Julia et al., "Triflate-Subphthalocyanines: Versatile, Reactive Intermediates for Axial Functionalization at the Boron Atom" Angew. Chem. Int. Ed., 50 (2011) pp. 3506-3509.

Morse, Graham et al., "Aluminum Chloride Activation of Chloro-Boronsubphtalocyanine: a Rapid and Flexible Method for Axial Functionalization with an Expanded Set of Nucleophiles" Inorganic Chemistry 51 (2012) pp. 6460-6467.

Morse, Graham E et al., "Phthalimido-boronsubphtalocyanines: New Derivatives of Boronsubpthalocyanine with Bipolar Electrochemisty and Functionality in OLEDs" Applied Materials & Interfaces. 3 (2011) pp. 3538-3544.

Ma, Biwu et al. "Solution processable boron subphthalocyanine derivatives as active materials for organic photovoltaics" SPIE 7416 (2009).

Menke, S Matthew et al., "Tandem Organic Photodetectors With Tunable, Broadband Response" Applied Physics Letters 101 (2012).

Seo, Hokuto et al., "Color Sensors With Three Vertically Stacked Organic Photodectors" Japanese Journal of Applied Sciences. 46. No. 49 (2007) pp. L1240-L1242.

Aihara, Satoshi et al., "Stacked Image Sensor With Green- and Red-Sensitive Organic Photoconductive Films Applying Zinc Oxide Thin-Film Transistors to a Signal Readout Circuit" IEEE Transactions on Electron Devices. 56. No. 11. (2009).

Ihama, Mikio et al., "CMOS Image Sensor With a Thin Overlaid Panchromatic Organic Photoconductive Layer for Sensors With Reduced Pixel Size" IDW. (2009) pp. 2123-2126.

* cited by examiner

ORGANIC PHOTOELECTRONIC DEVICE AND IMAGE SENSOR AND ELECTRONIC DEVICE

CROSS REFERENCE TO RELATED APPLICATION

This application claims priority to and the benefit of Korean Patent Application No. 10-2014-0101908 filed in the Korean Intellectual Property Office on Aug. 7, 2014, the entire contents of which are incorporated herein by reference.

BACKGROUND

1. Field

Example embodiments relate to an organic photoelectronic device, an image sensor, and an electronic device.

2. Description of the Related Art

A photoelectronic device converts light into an electrical signal using photoelectronic effects, and may include a photodiode and/or a phototransistor. The photoelectronic device may be applied to an image sensor, a solar cell and/or an organic light emitting diode.

An image sensor including a photodiode requires relatively high resolution and thus a relatively small pixel. At present, a silicon photodiode is widely used, but the silicon photodiode has a problem of deteriorated sensitivity and has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectronic device being capable of increasing wavelength selectivity by improving light absorption characteristics in a thin film state.

Example embodiments also provide an image sensor including the organic photoelectronic device and decreasing crosstalk between adjacent pixels.

Example embodiments also provide an electronic device including the image sensor.

According to example embodiments, an organic photoelectronic device includes a first electrode and a second electrode facing each other, and an active layer between the first electrode and the second electrode and including a first compound represented by the following Chemical Formula 1 or 2.

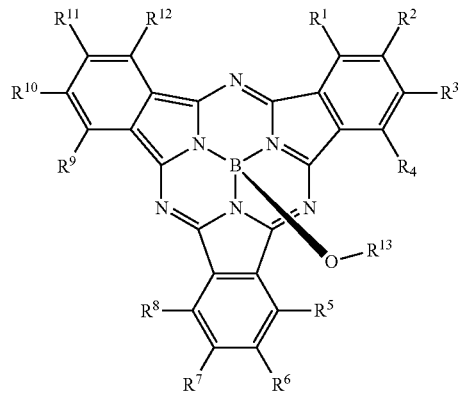

[Chemical Formula 1]

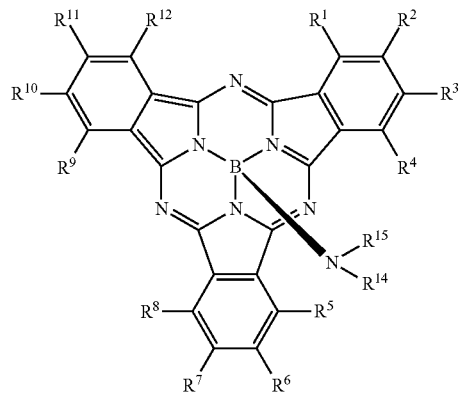

[Chemical Formula 2]

In the Chemical Formula 1 and 2, each of $R^1$ to $R^{12}$ are independently one of hydrogen and a monovalent organic group, each of $R^1$ to $R^{12}$ are independently present or are fused to each other to provide a ring, $R^{13}$ is one of a substituted or unsubstituted $C_6$ to $C_{30}$ aryl group, a substituted or unsubstituted $C_3$ to $C_{30}$ heteroaryl group, a substituted or unsubstituted silyl group, and a combination thereof, and each of $R^{14}$ and $R^{15}$ are independently one of a substituted or unsubstituted $C_6$ to $C_{30}$ aryl group, a substituted or unsubstituted $C_3$ to $C_{30}$ heteroaryl group, and a combination thereof, and a ratio between a FWHM (full width at half maximum) of a light absorption curve depending on a wavelength of the first compound in a solution state and in a thin film state satisfies the following Relationship Equation 1: FWHM2/FWHM1<2.5.

In the Relationship Equation 1, FWHM1 is the FWHM of the light absorption curve depending on the wavelength in the solution state, and FWHM2 is the FWHM of the light absorption curve depending on the wavelength in the thin film state.

The first compound may selectively absorb light in a green wavelength region.

The FWHM of the light absorption curve of the first compound depending on the wavelength in the thin film state is less than or equal to about 70 nm.

The FWHM of the light absorption curve of the first compound depending on the wavelength in the thin film state may be about 30 nm to about 70 nm.

The first compound may be present in an amorphous state in the active layer.

Each of the $R^1$ to $R^{12}$ of the Chemical Formula 1 and 2 may independently be one of hydrogen, a substituted or unsubstituted $C_1$ to $C_{30}$ aliphatic hydrocarbon group, a substituted or unsubstituted $C_6$ to $C_{30}$ aromatic hydrocarbon group, a substituted or unsubstituted $C_1$ to $C_{30}$ aliphatic heterocyclic group, a substituted or unsubstituted $C_2$ to $C_{30}$ aromatic heterocyclic group, a substituted or unsubstituted $C_1$ to $C_{30}$ alkoxy group, a substituted or unsubstituted $C_1$ to $C_{30}$ aryloxy group, a thio group, an alkylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, and a combination thereof, the $R^{13}$ of the Chemical Formula 1 may be one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, a silyl group substituted with an alkyl group, a silyl group substituted with an aryl group, and a combination thereof, and each of the $R^{14}$ and $R^{15}$ of the above Chemical Formula 2 may independently be one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, and a combination thereof.

The active layer may further include a second compound being capable of absorbing light in a visible ray region.

The second compound may include one of fullerene and a fullerene derivative.

The second compound may include one of thiophene and a thiophene derivative.

The first electrode and the second electrode may be light-transmitting electrodes.

According to example embodiments, an image sensor includes the organic photoelectronic device.

The image sensor may include a semiconductor substrate integrated with a plurality of first photo-sensing devices sensing light in a blue wavelength region and a plurality of second photo-sensing devices sensing light in a red wavelength region, and the organic photoelectronic device may be on the semiconductor substrate and selectively absorbing light in a green wavelength region.

The first photo-sensing device and the second photo-sensing device may be stacked in a vertical direction on the semiconductor substrate.

The image sensor may further include a color filter layer between the semiconductor substrate and the organic photoelectronic device, and including a blue filter selectively absorbing light in a blue wavelength region and a red filter selectively absorbing light in a red wavelength region.

The organic photoelectronic device selectively absorbing light in the green wavelength region, a blue photoelectronic device selectively absorbing light in a blue wavelength region, and a red photoelectronic device selectively absorbing light in a red wavelength region may be stacked.

The image sensor may have an average crosstalk value of less than or equal to about 30%.

According to example embodiments, an electronic device includes the image sensor.

DETAILED DESCRIPTION

Figure 1:
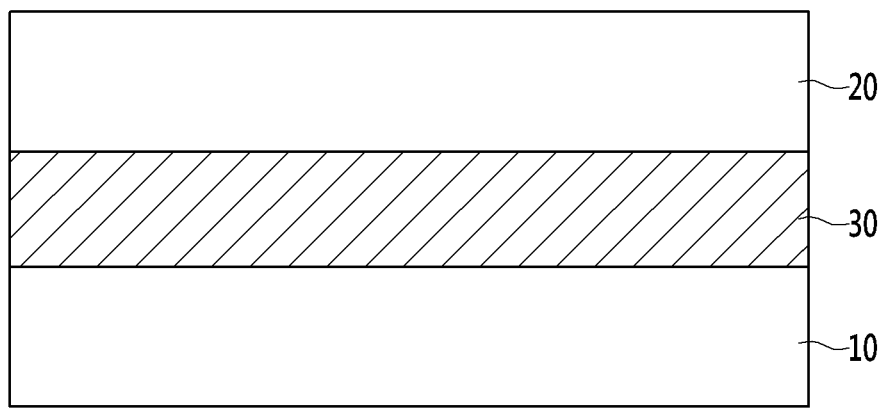
FIG. 1 is a cross-sectional view showing an organic photoelectronic device according to example embodiments.

Example embodiments of the present inventive concepts will hereinafter be described in detail, and may be more easily performed by those who have common knowledge in the related art. However, this disclosure may be embodied in many different forms and is not construed as limited to the example embodiments set forth herein.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "substituted" refers to one substituted with a substituent selected from a halogen (F, Br, Cl or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

Hereinafter, an organic photoelectronic device according to example embodiments is described with reference with the drawings.

FIG. 1 is a cross-sectional view of an organic photoelectronic device according to example embodiments.

Referring to FIG. 1, an organic photoelectronic device 100 according to example embodiments includes a first electrode 10 and a second electrode 20, and an active layer 30 interposed between the first electrode 10 and the second electrode 20.

One of the first electrode 10 and the second electrode 20 is an anode and the other is a cathode. At least one of the first electrode 10 and the second electrode 20 may be a light-transmitting electrode, and the light-transmitting electrode may be made of, for example, a transparent conductor (e.g., indium tin oxide (ITO) or indium zinc oxide (IZO)), or a metal thin layer of a thin monolayer or multilayer. When one of the first electrode 10 and the second electrode 20 is a non-light-transmitting electrode, the one of the first electrode 10 and the second electrode 20 may be made of, for example, an opaque conductor (e.g., aluminum (Al)).

For example, the first electrode 10 and the second electrode 20 may be light-transmitting electrodes.

The active layer 30 includes a p-type semiconductor and an n-type semiconductor to form a pn junction, and absorbs external light to generate excitons and then separates the generated excitons into holes and electrons.

The active layer 30 includes a first compound as a p-type semiconductor or an n-type semiconductor.

The first compound is a light-absorbing body being capable of selectively absorbing light in a predetermined or given wavelength region of a visible ray region. For example, the first compound may selectively absorb light in a green wavelength region, and may have, for example, a maximum absorption wavelength ($\lambda_{max}$) of about 500 nm to about 600 nm and an energy bandgap of about 2.0 to about 2.5 eV.

Wavelength selectivity for absorbing light in a predetermined or given wavelength region of a visible ray region may be indicated by a FWHM. Herein, the FWHM is a width of a wavelength corresponding to a half of a maximum absorption point. As used herein, when specific definition is not otherwise provided, it may be defined by absorbance measured by UV-Vis spectroscopy. A smaller FWHM indicates selective absorption of light in a narrow wavelength region and high wavelength selectivity.

A ratio of FWHMs of the light absorption curve depending on a wavelength of the first compound in a solution state and in a thin film state may satisfy the following Relationship Equation 1.

$$FWHM2/FWHM1 < 2.5 \quad \text{[Relationship Equation 1]}$$

In the Relationship Equation 1,

FWHM1 is a FWHM of the light absorption curve depending on a wavelength in a solution state, and FWHM2 is a FWHM of the light absorption curve depending on a wavelength in a thin film state.

The thin film may be formed by vacuum deposition.

The Relationship Equation 1 indicates the FWHM variation in a thin film state relative to the FWHM in a solution state of the first compound.

By satisfying the Relationship Equation 1, the light absorption characteristics of the first compound in a solution state are not significantly different from the light absorption characteristics of the first compound in a thin film state, and the light absorption characteristics of the first compound in a thin film state are not degraded. Accordingly, when the first compound is applied to the active layer 30 of the organic photoelectronic device, the first compound may ensure wavelength selectivity for a predetermined or given wavelength region.

For example, the ratio between a FWHM of a light absorption curve depending on a wavelength of the first compound in a solution state and in a thin film state may satisfy the following Relationship Equation 1A.

$$1.0 \geq FWHM2/FWHM1 < 2.5 \quad \text{[Relationship Equation 1A]}$$

For example, a ratio between a FWHM of a light absorption curve depending on a wavelength of the first compound in a solution state and in a thin film state may satisfy the following Relationship Equation 1B.

$$1.3 < FWHM2/FWHM1 < 2.5 \quad \text{[Relationship Equation 1B]}$$

For example, a ratio between a FWHM of a light absorption curve depending on a wavelength of the first compound in a solution state and in a thin film state may satisfy the following Relationship Equation 1C.

$$1.5 < FWHM2/FWHM1 \leq 2.3 \quad \text{[Relationship Equation 1C]}$$

The first compound may have a FWHM of less than or equal to about 70 nm in the light absorption curve depending on a wavelength in a thin film state. Within the range, the first compound may have a FWHM of about 30 nm to about 70 nm in the light absorption curve depending on a wavelength in a thin film state.

The first compound may be present in an amorphous state in a thin film state, and for example, about 30% to about 100% of the first compound may be present in an amorphous state in a thin film state, for another example, about 50 to about 100% of the first compound may be present in an amorphous state in a thin film state, and for another example, about 70% to about 100% of the first compound may be present in an amorphous state in a thin film state.

The first compound is present in an amorphous state in a thin film state, and thereby response speed and dark current characteristics may be ensured and improved performance of an image sensor may be provided when the organic photoelectronic device is applied to a device such as an image sensor.

The amorphous state may be, for example, confirmed with an AFM (Atomic Force Microscope) and/or by XRD (X-ray diffraction).

The first compound may selectively absorb light in a green wavelength region, and may be, for example, represented by the following Chemical Formula 1 or 2.

[Chemical Formula 1]

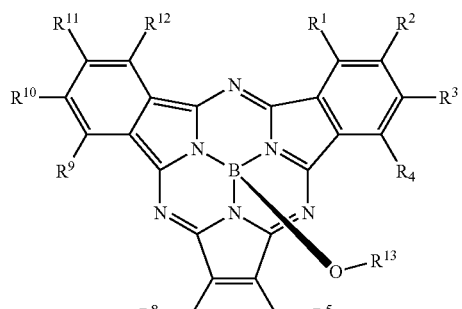

[Chemical Formula 2]

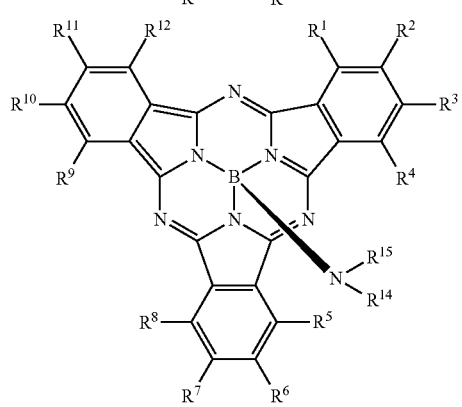

In the Chemical Formula 1 and 2, each of $R^1$ to $R^{12}$ are independently one of hydrogen and a monovalent organic group, each of $R^1$ to $R^{12}$ are independently present or are fused to each other to provide a ring, $R^{13}$ is one of a substituted or unsubstituted $C_6$ to $C_{30}$ aryl group, a substituted or unsubstituted $C_3$ to $C_{30}$ heteroaryl group, a substituted or unsubstituted silyl group, and a combination thereof, and each of $R^{14}$ and $R^{15}$ are independently one of a substituted or unsubstituted $C_6$ to $C_{30}$ aryl group, a substituted or unsubstituted $C_3$ to $C_{30}$ heteroaryl group, and a combination thereof.

For example, the $R^1$ to $R^{12}$ of the Chemical Formula 1 or 2 may independently be one of hydrogen, a substituted or unsubstituted $C_1$ to $C_{30}$ aliphatic hydrocarbon group, a substituted or unsubstituted $C_6$ to $C_{30}$ aromatic hydrocarbon group, a substituted or unsubstituted $C_1$ to $C_{30}$ aliphatic heterocyclic group, a substituted or unsubstituted $C_2$ to $C_{30}$ aromatic heterocyclic group, a substituted or unsubstituted $C_1$ to $C_{30}$ alkoxy group, a substituted or unsubstituted $C_1$ to $C_{30}$ aryloxy group, a thio group, an alkylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, and a combination thereof.

For example, the $R^{13}$ of the Chemical Formula 1 may be one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, a silyl group substituted with an alkyl group, a silyl group substituted with an aryl group, and a combination thereof.

For example, each of the $R^{14}$ and $R^{15}$ of the Chemical Formula 2 may independently be one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, and a combination thereof.

The first compound represented by the Chemical Formula 1 or 2 includes a planar backbone including bonds of boron (B), nitrogen (N), and carbon (C), and an axis substituent of B—O—$R^{13}$ or B—O—$NR^{14}R^{15}$ stretched out in a vertical direction relative to the planar backbone. Through such a structure, molecular aggregation of the first compound may be reduced and/or inhibited, and thus film quality in a thin film state may be improved. Accordingly, the light absorption characteristics of the first compound in a solution state are not significantly different from the light absorption characteristics of the first compound in a thin film state, and the light absorption characteristics of the first compound in a thin film state are not degraded.

The first compound may have a molecular weight of greater than or equal to about 500. Within the range, the first compound may, for example, have a molecular weight of about 500 to about 1200, and for another example, about 500 to 800. When the first compound has a molecular weight within the range, the crystallinity of the first compound may be inhibited and thermal decomposition during formation of a thin film by deposition may be prevented or reduced.

The first compound may be included as a p-type semiconductor or an n-type semiconductor. When the first compound is included as a p-type semiconductor, a second compound that is an n-type semiconductor may be further included, and when the first compound is included as an n-type semiconductor, a second compound that is a p-type semiconductor may be further included.

The second compound is not particularly limited, and may be a light-absorbing material, for example, a material being capable of absorbing a part or a whole of a visible ray region of about 380 nm to about 780 nm. The second compound may be formed in a thin film by deposition such as vacuum deposition, with the first compound.

For example, the second compound may be fullerene, e.g., $C_{60}$ or a fullerene derivative. For example, the second compound may be thiophene or a thiophene derivative.

The thiophene derivative may be, for example, represented by the following Chemical Formula 3 or Chemical Formula 4, but is not limited thereto.

[Chemical Formula 3]

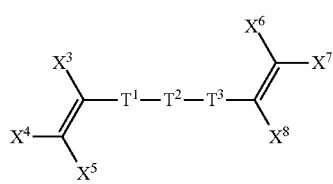

[Chemical Formula 4]

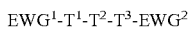

EWG$^1$-T$^1$-T$^2$-T$^3$-EWG$^2$

In the Chemical Formula 3 or 4, each of $T^1$, $T^2$, and $T^3$ are an aromatic ring including a substituted or unsubstituted thiophene moiety, each of $T^1$, $T^2$, and $T^3$ are independently present or are fused to each other, each of $X^3$ to $X^8$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heterocyclic group, a cyano group, and a combination thereof, and EWG$^1$ and EWG$^2$ are independently an electron withdrawing group.

For example, in the Chemical Formula 3, at least one of $X^3$ to $X^8$ may be an electron withdrawing group.

For example, in the Chemical Formula 3, at least one of $X^3$ to $X^8$ may be a cyano group.

For example, in the Chemical Formula 3, $T^1$, $T^2$, and $T^3$ may be selected from groups listed in the following Group 1.

[Group 1]

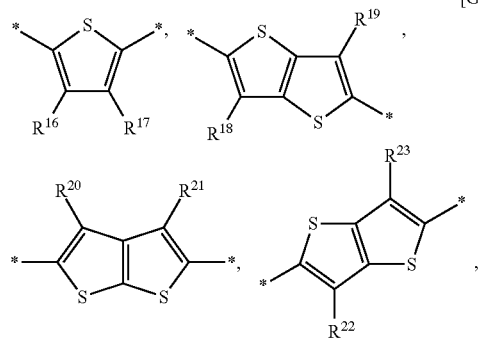

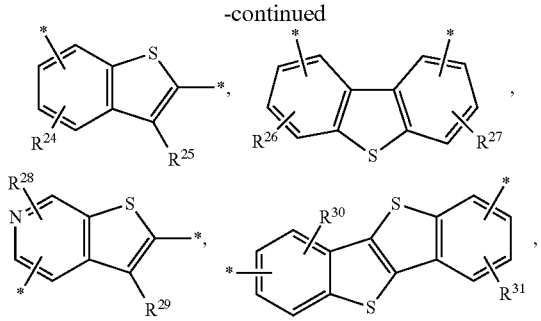

In the Group 1, each of $R^{16}$ to $R^{31}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

For example, the thiophene derivative may be one of compounds represented by the following Chemical Formulae 3a to 3b, 4a, and 4b.

[Chemical Formula 3a]

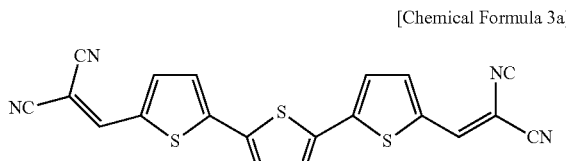

[Chemical Formula 3b]

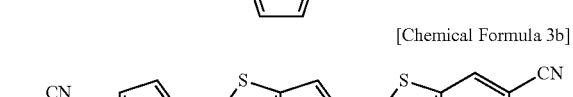

[Chemical Formula 3c]

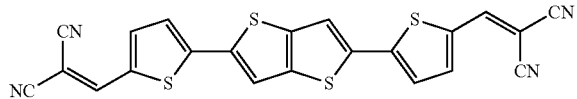

[Chemical Formula 4a]

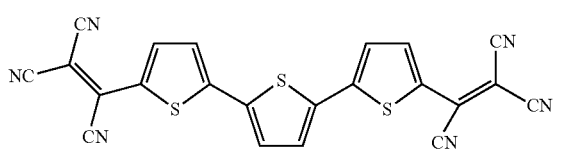

[Chemical Formula 4b]

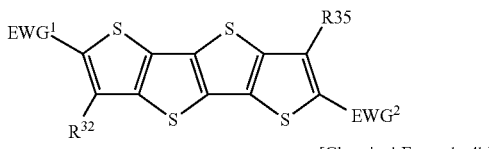

Herein, each of $R^{32}$ to $R^{35}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, and EWG$^1$ and EWG$^2$ are independently an electron withdrawing group. The electron withdrawing group may be, for example, a cyano group or a cyano-containing group.

The active layer 30 may be a single layer or a multilayer. The active layer 30 may be, for example, an intrinsic layer (I layer), a p-type layer/I layer, an I layer/n-type layer, a p-type layer/I layer/n-type layer and/or a p-type layer/n-type layer.

The intrinsic layer (I layer) may include the p-type semiconductor compound and the n-type semiconductor compound in a ratio of about 1:100 to about 100:1. The compounds may be included in a ratio ranging from about 1:50 to about 50:1 within the range, specifically, about 1:10 to about 10:1, and more specifically, about 1:1. When the p-type and n-type semiconductors have a composition ratio within the range, an exciton may be effectively produced and a pn junction may be effectively formed.

The p-type layer may include the p-type semiconductor compound, and the n-type layer may include the n-type semiconductor compound.

The active layer 30 may have a thickness of about 1 nm to about 500 nm, and specifically, about 5 nm to about 300 nm. When the active layer 30 has a thickness within the range, the active layer may effectively absorb light, effectively separate holes from electrons, and deliver them, thereby effectively improving photoelectronic conversion efficiency. An optimal or desired thickness of a thin film may be, for example, determined by an absorption coefficient of the active layer 30, and may be, for example, a thickness being capable of absorbing light of at least about 70% or more, for example about 80% or more, and for another example about 90%.

In the organic photoelectronic device 100, when light enters from the first electrode 10 and/or second electrode 20, and when the active layer 30 absorbs light having a predetermined or given wavelength region, excitons may be produced from the inside. The excitons are separated into holes and electrons in the active layer 30, and the separated holes are transported to an anode that is one of the first electrode 10 and second electrode 20, while the separated electrons are transported to the cathode that is the other of and the first electrode 10 and second electrode 20 so as to flow a current in the organic photoelectronic device.

Hereinafter, an organic photoelectronic device according to example embodiments is described.

Figure 2:
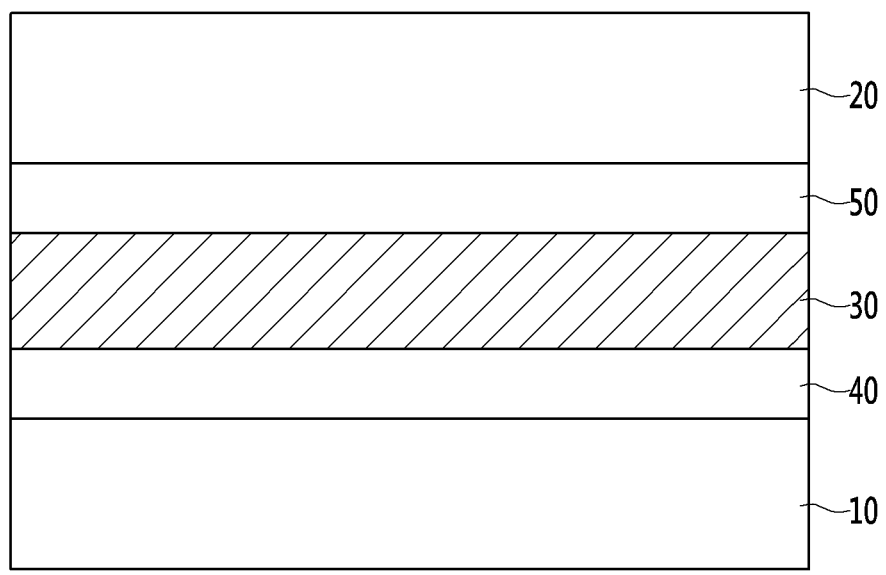
FIG. 2 is a cross-sectional view showing an organic photoelectronic device according to example embodiments.

FIG. 2 is a cross-sectional view showing an organic photoelectronic device according to example embodiments.

Referring to FIG. 2, an organic photoelectronic device 200 according to example embodiments includes a first electrode 10 and a second electrode 20 facing each other, and an active layer 30 interposed between the first electrode 10 and the second electrode 20, like the example embodiment illustrated in FIG. 1.

However, the organic photoelectronic device 200 according to example embodiments further includes charge auxiliary layers 40 and 50 between the first electrode 10 and the active layer 30, and the second electrode 20 and the active layer 30, unlike the example embodiment illustrated in FIG. 1. The charge auxiliary layers 40 and 50 may facilitate the transfer of holes and electrons separated from the active layer 30, so as to increase efficiency.

The charge auxiliary layers 40 and 50 may be at least one selected from a hole injection layer (HIL) for facilitating hole injection, a hole transport layer (HTL) for facilitating hole transport, an electron blocking layer (EBL) for preventing or inhibiting electron transport, an electron injection layer (EIL) for facilitating electron injection, an electron transport layer (ETL) for facilitating electron transport, and a hole blocking layer (HBL) for preventing or inhibiting hole transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide, e.g., molybdenum oxide, tungsten oxide and/or nickel oxide.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted.

The organic photoelectronic device may be applied to various fields, for example a solar cell, an image sensor, a photodetector, a photo-sensor, and an organic light emitting diode (OLED), but is not limited thereto.

Hereinafter, an example of an image sensor including the organic photoelectronic device is described referring to drawings. As an example of an image sensor, an organic CMOS image sensor is described.

Figure 3:
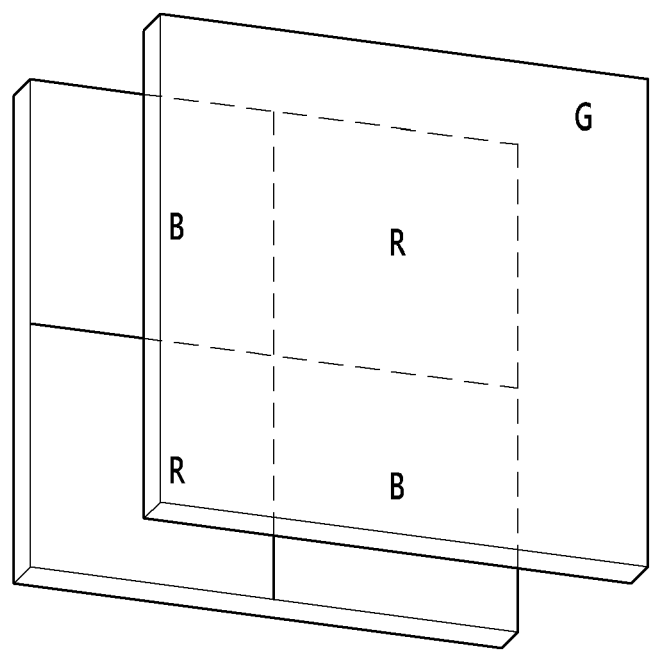
FIG. 3 is a schematic top plan view showing an organic CMOS image sensor according to example embodiments.
Figure 4:
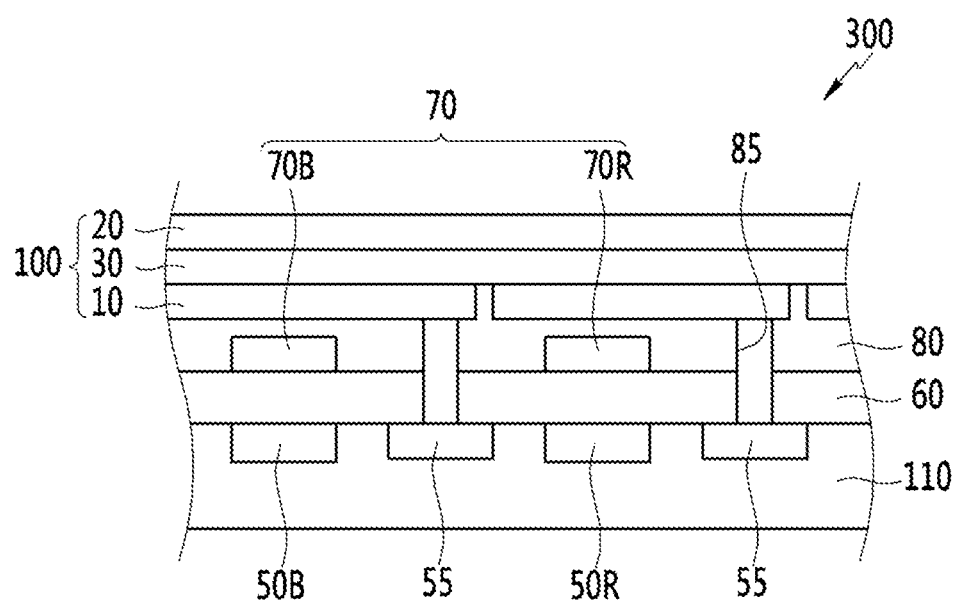
FIG. 4 is a cross-sectional view showing the organic CMOS image sensor of FIG. 3.

FIG. 3 is a schematic top plan view of an organic CMOS image sensor according to example embodiments, and FIG. 4 is a cross-sectional view of the organic CMOS image sensor of FIG. 3.

Referring to FIGS. 3 and 4, an organic CMOS image sensor 300 according to example embodiments includes a semiconductor substrate 110 integrated with photo-sensing devices 50B and 50R, a transmission transistor (not shown), a charge storage device 55, a lower insulation layer 60, a color filter layer 70, an upper insulation layer 80, and an organic photoelectronic device 100.

The semiconductor substrate 110 may be a silicon substrate, and is integrated with the photo-sensing device 50, the transmission transistor, and the charge storage device 55. The photo-sensing devices 50R and 50B may be photodiodes.

The photo-sensing devices 50B and 50R, the transmission transistor, and/or the charge storage device 55 may be integrated in each pixel, and as shown in the drawing, the photo-sensing devices 50B and 50R may be included in a blue pixel and a red pixel and the charge storage device 55 may be included in a green pixel.

The photo-sensing devices 50B and 50R sense light, the information sensed by the photo-sensing devices may be transferred by the transmission transistor, the charge storage device 55 is electrically connected with the organic photoelectronic device 100, and the information of the charge storage device 55 may be transferred by the transmission transistor.

In drawings, the photo-sensing devices 50B and 50R are, for example, arranged in parallel without limitation, and the blue photo-sensing device 50B and the red photo-sensing device 50R may be stacked in a vertical direction.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material, e.g., a silicon oxide and/or a silicon nitride, or a low dielectric constant (low K) material, e.g., SiC, SiCOH, SiCO, and SiOF. The lower insulation layer 60 has a trench exposing the charge storage device 55. The trench may be filled with fillers.

The color filter layer 70 is formed on the lower insulation layer 60. The color filter layer 70 includes a blue filter 70B formed in the blue pixel and a red filter 70R filled in the red pixel. In example embodiments, a green filter is not included, but a green filter may be further included.

The color filter layer 70 may be omitted. For example, when the blue photo-sensing device 50B and the red photo-sensing device 50R are stacked in a vertical direction, the blue photo-sensing device 50B and the red photo-sensing device 50R may selectively absorb light in each wavelength region depending on their stack depth, and the color filter layer 70 may not be equipped.

The upper insulation layer 80 is formed on the color filter layer 70. The upper insulation layer 80 eliminates a step caused by the color filter layer 70 and smoothes the surface. The upper insulation layer 80 and the lower insulation layer 60 may include a contact hole (not shown) exposing a pad, and a through-hole 85 exposing the charge storage device 55 of the green pixel.

The organic photoelectronic device 100 is formed on the upper insulation layer 80. The organic photoelectronic device 100 includes the first electrode 10, the active layer 30, and the second electrode 120 as described above.

The first electrode 10 and the second electrode 20 may be transparent electrodes, and the active layer 30 is the same as described above. The active layer 30 selectively absorbs light in a green wavelength region and replaces a color filter of a green pixel.

When light enters from the second electrode 20, the light in a green wavelength region may be mainly absorbed in the active layer 30 and photoelectronically converted, while the light in the rest of the wavelength region passes through first electrode 10 and may be sensed in the photo-sensing devices 50B and 50R.

As described above, the organic photoelectronic devices selectively absorbing light in a green wavelength region are stacked and thereby a size of an image sensor may be decreased and a down-sized image sensor may be realized.

As described above, the first compound represented by the above Chemical Formula 1 as a p-type or n-type semiconductor compound is prevented or reduced from being aggregated in a thin film state, and light absorption characteristics depending on a wavelength may be maintained. Accordingly, green wavelength selectivity may be maintained as it is and crosstalk caused by unnecessary absorption light in a wavelength region except green may be decreased while increasing sensitivity.

In FIG. 4, the organic photoelectronic device 100 of FIG. 1 is included, but it is not limited thereto, and thus the organic photoelectronic device 200 of FIG. 2 may be applied in the same manner.

Figure 5:
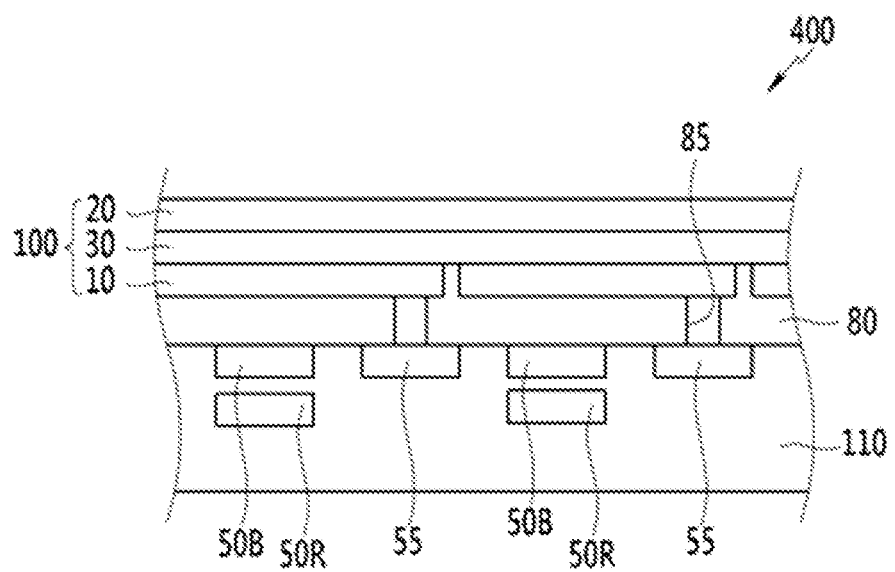
FIG. 5 is a schematic cross-sectional view showing an organic CMOS image sensor according to example embodiments.

FIG. 5 is a schematic cross-sectional view showing an organic CMOS image sensor 400 according to example embodiments.

The organic CMOS image sensor 400 according to example embodiments includes a semiconductor substrate 110 integrated with photo-sensing devices 50B and 50R, a transmission transistor (not shown), a charge storage device 55, an upper insulation layer 80, and an organic photoelectronic device 100, like the example embodiment illustrated in FIG. 4.

However, the organic CMOS image sensor 300 according to example embodiments includes the blue photo-sensing device 50B and the red photo-sensing device 50R that are stacked, and does not include a color filter layer 70, unlike the example embodiment illustrated in FIG. 4. The blue photo-sensing device 50B and the red photo-sensing device 50R are electrically connected with the charge storage device (not shown), and the information of the charge storage device 55 may be transferred by the transmission transistor. The blue photo-sensing device 50B and the red photo-sensing device 50R may selectively absorb light in each wavelength region depending on a stack depth.

As described above, the organic photoelectronic devices selectively absorbing light in a green wavelength region are stacked and the red photo-sensing device and the blue photo-sensing device are stacked, and thereby a size of an image sensor may be decreased and a down-sized image sensor may be realized. As described above, the organic photoelectronic device 100 has improved green wavelength selectivity, and crosstalk caused by unnecessary absorption light in a wavelength region except green may be decreased while increasing sensitivity.

In FIG. 5, the organic photoelectronic device 100 of FIG. 1 is included, but it is not limited thereto, and thus the organic photoelectronic device 200 of FIG. 2 may be applied in the same manner.

Figure 6:
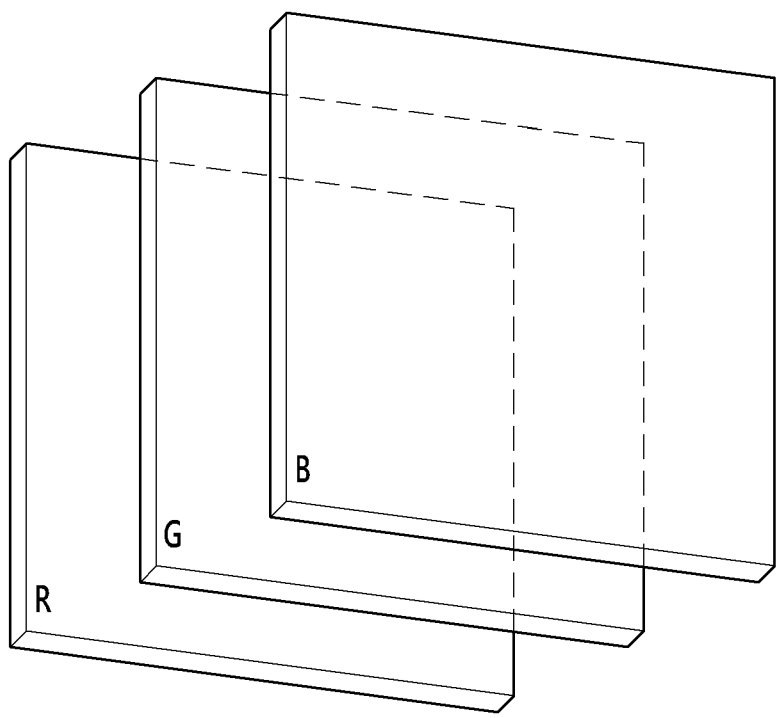
FIG. 6 is a schematic top plan view showing an organic CMOS image sensor according to example embodiments.

FIG. 6 is a schematic top plan view of an organic CMOS image sensor according to example embodiments.

The organic CMOS image sensor according to example embodiments includes a green photoelectronic device selectively absorbing light in a green wavelength region, a blue photoelectronic device selectively absorbing light in a blue wavelength region, and a red photoelectronic device selectively absorbing light in a green wavelength region and that are stacked.

In the drawing, the red photoelectronic device, the green photoelectronic device, and the blue photoelectronic device are sequentially stacked, but the stack order may be changed without limitation.

The green photoelectronic device may be the above organic photoelectronic device 100, the blue photoelectronic device may include electrodes facing each other and an active layer interposed therebetween and including an organic material selectively absorbing light in a blue wavelength region, and the red photoelectronic device may include electrodes facing each other and an active layer interposed therebetween and including an organic material selectively absorbing light in a red wavelength region.

As described above, the organic photoelectronic device selectively absorbing light in a red wavelength region, the organic photoelectronic device selectively absorbing light in a green wavelength region, and the organic photoelectronic device selectively absorbing light in a blue wavelength region are stacked, and thereby a size of an image sensor may be decreased and a down-sized image sensor may be realized.

The image sensor may be applied to various electronic devices, for example, a mobile phone and/or a digital camera, but is not limited thereto.

Hereinafter, the present disclosure is illustrated in more detail with reference to examples. However, these are examples, and the present disclosure is not limited thereto.

Preparation of First Compound

Synthesis Example 1

[Chemical Formula A]

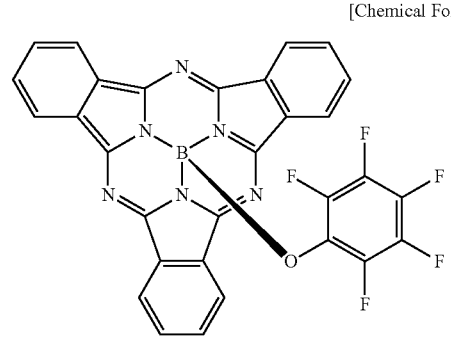

10.0 g of boron subphthalocyanine chloride (Aldrich) and 21.3 g of pentafluorophenol (Aldrich Corporation) are heated and refluxed in 150 ml of dry toluene for 15 hours. Subsequently, the reaction solution is concentrated under a reduced pressure and purified using silica gel column chromatography to obtain the compound represented by the Chemical Formula A.

Synthesis Example 2

[Chemical Formula B]

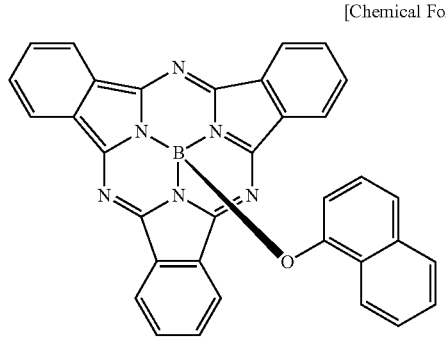

The compound represented by the Chemical Formula B is synthesized according to the same method as Synthesis Example 1, except that 6.6 g of 1-naphthol (Aldrich Corporation) is used instead of pentafluorophenol.

Synthesis Example 3

[Chemical Formula C]

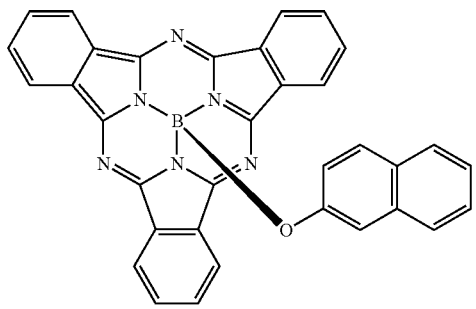

The compound represented by the Chemical Formula C is synthesized according to the same method as Synthesis Example 1, except that 6.6 g of 2-naphthol (Aldrich Corporation) is used instead of pentafluorophenol.

Synthesis Example 4

[Chemical Formula D]

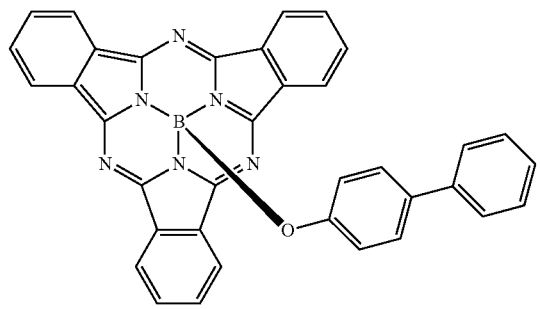

The compound represented by the Chemical Formula D is synthesized according to the same method as Synthesis Example 1, except that 7.9 g of 4-phenylphenol (Aldrich Corporation) is used instead of pentafluorophenol.

Synthesis Example 5

[Chemical Formula E]

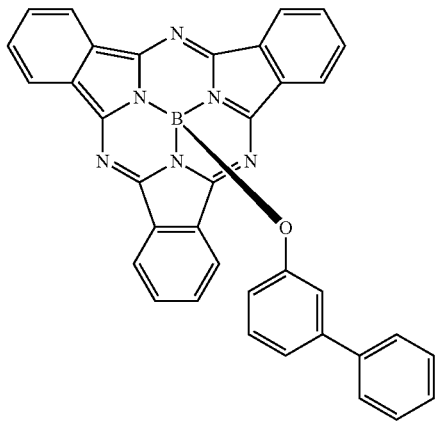

The compound represented by the Chemical Formula E is synthesized according to the same method as Synthesis Example 1, except that 7.9 g of 3-phenylphenol (Aldrich Corporation) is used instead of pentafluorophenol.

Synthesis Example 6

[Chemical Formula F]

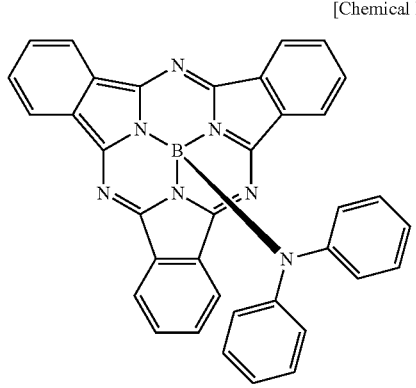

10.0 g of boron subphthalocyanine chloride (Aldrich Corporation), 7.9 g of diphenylamine (Aldrich Corporation), and 7.4 g of silver trifluoromethanesulfonate (Dong Kyung Co., Ltd.) are heated and refluxed in 150 ml of dry toluene for 15 hours. 200 ml of dichloromethane is added thereto, the solution is filtered, and the filtrated solution is concentrated under pressure and purified using silica gel column chromatography to obtain a compound F.

Synthesis Example 7

[Chemical Formula G]

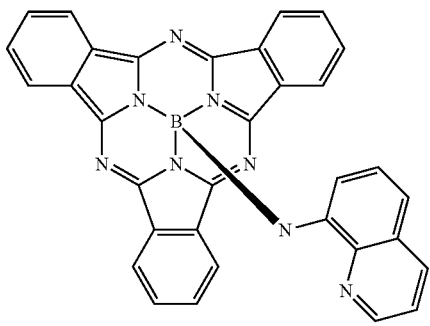

The compound represented by the Chemical Formula G is synthesized according to the same method as Synthesis Example 6, except that 6.8 g of 8-quinolinol (Aldrich Corporation) is used instead of diphenylamine.

Synthesis Example 8

[Chemical Formula H]

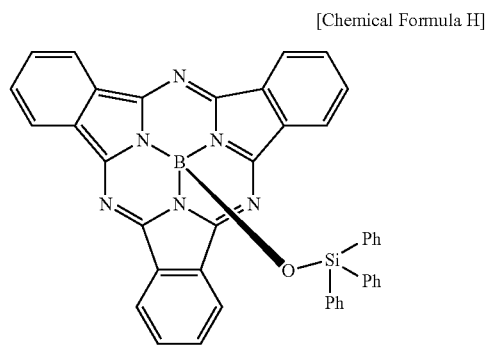

20.0 g of boron subphthalocyanine chloride (Aldrich Corporation), 32.0 g of triphenylsilanol (Dong Kyung Co., Ltd.), and 14.8 g of silver trifluoromethanesulfonate (Dong Kyung Co., Ltd.) are heated and refluxed in 150 ml of dry toluene for 15 hours. 200 ml of methylene chloride is added thereto, the solution is filtered, and the filtrated solution is concentrated under pressure and purified using silica gel column chromatography to obtain a compound H.

Synthesis Example 9

[Chemical Formula I]

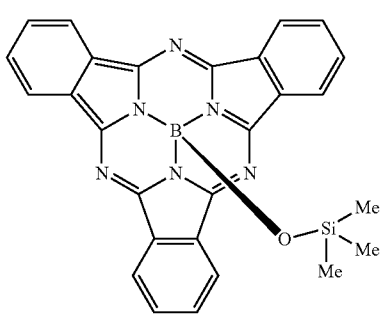

The compound represented by the Chemical Formula I is synthesized according to the same method as Synthesis Example 8, except that 23.8 g of potassium trimethyl siloxide (Aldrich Corporation) is used instead of triphenylsilanol and a reaction temperature is 50° C.

Comparative Synthesis Example 1

The compound (sublimation purified product, Lumtec) represented by the following Chemical Formula J is prepared.

[Chemical Formula J]

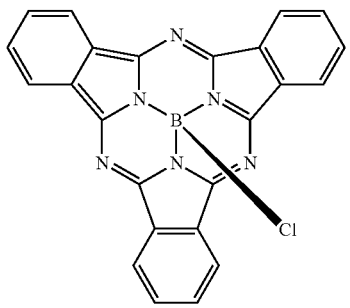

Comparative Synthesis Example 2

The compound represented by the following Chemical Formula K is prepared according to Angewandte Chemie, International Edition Volume 50 Issue 15 Pages 3506-3509.

[Chemical Formula K]

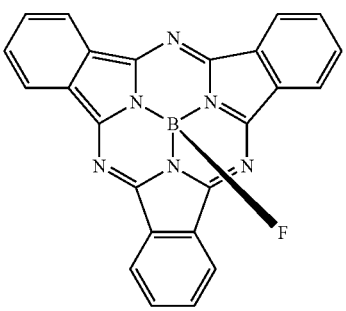

Comparative Synthesis Example 3

The compound represented by the Chemical Formula L is synthesized according to the same method as Synthesis Example 6, except that 50 ml of methanol (Aldrich Corporation) is used instead of diphenylamine.

[Chemical Formula L]

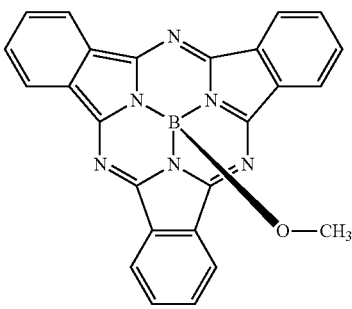

Evaluation I

Evaluation 1

Light Absorption Characteristics

Light absorption characteristics of the compounds according to Synthesis Examples 1 to 9 and Comparative Synthesis Examples 1 to 3 are evaluated depending on a wavelength.

The light absorption characteristics are evaluated in both solution and thin film states of the compounds.

The light absorption characteristics in a solution state are evaluated by dissolving each compound according to Synthesis Examples 1 to 9 and Comparative Synthesis Examples 1 to 3 in a concentration of $1.0 \times 10^{-5}$ mol/L in toluene.

The light absorption characteristics in a thin film state are evaluated by thermally evaporating each compound according to Synthesis Examples 1 to 9 and Comparative Synthesis Examples 1 to 3 at a speed of 0.5-1.0 Å/s under high vacuum ($<10^{-7}$ Torr) to respectively form 70 nm-thick thin films and radiating ultraviolet (UV)-visible rays (UV-Vis) on the thin films with a Cary 5000 UV spectroscope (Varian Inc.).

Figure 7:
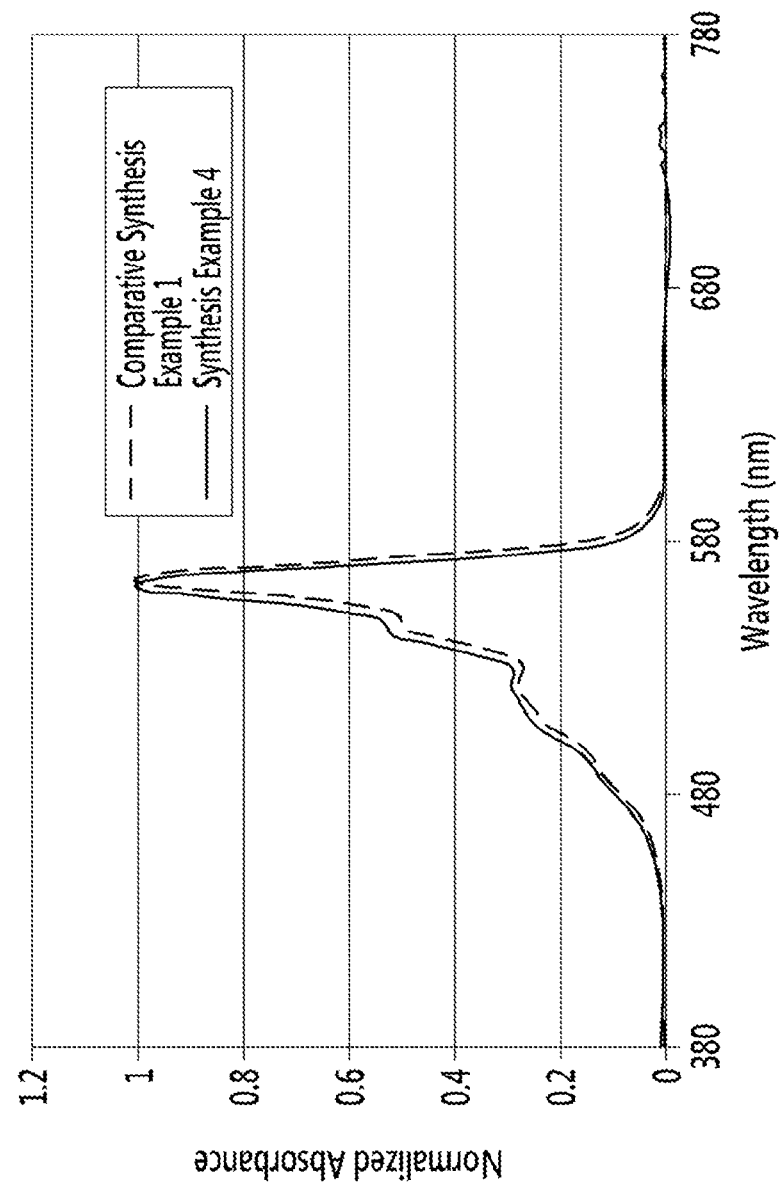
FIG. 7 is a graph showing light absorption characteristics of the compound according to Synthesis Example 4 and Comparative Synthesis Example 1 in a solution state.
Figure 8:
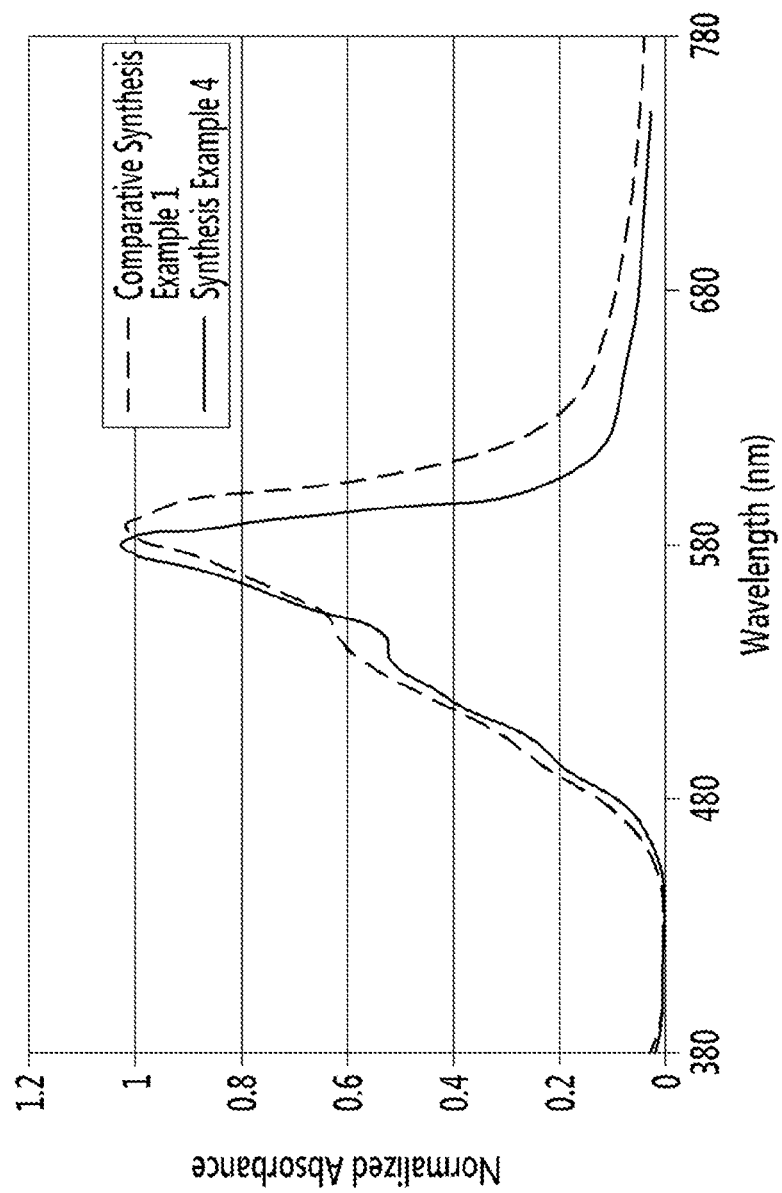
FIG. 8 is a graph showing light absorption characteristics of the compound according to Synthesis Example 4 and Comparative Synthesis Example 1 in a thin film state.

The results are provided in FIGS. 7 and 8 and Table 1.

FIG. 7 is a graph showing light absorption characteristics of the compound according to Synthesis Example 4 and Comparative Synthesis Example 1 in a solution state, and FIG. 8 is a graph showing light absorption characteristics of the compound according to Synthesis Example 4 and Comparative Synthesis Example 1 in a thin film state.

TABLE 1

| | $\lambda_{max}$ (nm) | | FWHM | | | |
|---|---|---|---|---|---|---|
| | solution | thin film | FWHM1 (solution, nm) | FWHM2 (thin film, nm) | FWHM2/ FWHM1 | State |
| Synthesis Example 1 | 564 | 581 | 28 | 48 | 1.7 | Amorphous |
| Synthesis Example 2 | 563 | 579 | 30 | 62 | 2.1 | Amorphous |
| Synthesis Example 3 | 563 | 580 | 29 | 63 | 2.2 | Amorphous |
| Synthesis Example 4 | 563 | 579 | 28 | 62 | 2.2 | Amorphous |
| Synthesis Example 5 | 563 | 580 | 29 | 65 | 2.2 | Amorphous |
| Synthesis Example 6 | 567 | 583 | 36 | 61 | 1.7 | Amorphous |
| Synthesis Example 7 | 563 | 581 | 29 | 65 | 2.2 | Amorphous |
| Synthesis Example 8 | 562 | 575 | 29 | 46 | 1.6 | Amorphous |

TABLE 1-continued

| | $\lambda_{max}$ (nm) | | FWHM | | | |
|---|---|---|---|---|---|---|
| | solution | thin film | FWHM1 (solution, nm) | FWHM2 (thin film, nm) | FWHM2/ FWHM1 | State |
| Synthesis Example 9 | 561 | 575 | 29 | 63 | 2.2 | Amorphous |
| Comparative Synthesis Example 1 | 565 | 587 | 23 | 81 | 3.5 | — |
| Comparative Synthesis Example 2 | 562 | 582 | 29 | 83 | 2.9 | — |
| Comparative Synthesis Example 3 | 561 | 581 | 28 | 75 | 2.7 | — |

Referring to FIG. 7 and Table 1, the compounds according to Synthesis Examples 1 to 9 show similar light absorption characteristics to those of the Comparative Synthesis Examples 1 to 3 in a solution state.

On the contrary, referring to FIG. 8 and Table 1, the compounds according to Synthesis Examples 1 to 9 show a significantly narrower FWHM compared with the compounds according to Comparative Synthesis Examples 1 to 2. For example, the compounds Synthesis Examples 1 to 9 have FWHM's of less than or equal to about 70 nm in a thin film state while the compounds according to Comparative Synthesis Examples 1 to 3 have FWHM's of greater than or equal to about 75 nm in a thin film state.

Particularly, the compounds according to Synthesis Examples 1 to 9 show a ratio of less than 2.5 between FWHMs in a solution state and in a thin film state, while the compounds according to Comparative Synthesis Examples 1 to 3 show a ratio of greater than 2.5 between FWHMs in a solution state and in a thin film state. From the results, the compounds according to Synthesis Examples 1 to 9 have higher green wavelength selectivity in a thin film state compared with the compounds according to Comparative Synthesis Examples 1 to 3.

Manufacture of Organic Photoelectronic Device

Example 1

An about 100 nm-thick anode is formed by sputtering ITO on a glass substrate, and then a 10 nm-thick charge auxiliary layer is formed thereon by depositing a molybdenum oxide ($MoO_x$, $0<x\leq3$). Subsequently, an 85 nm-thick active layer is formed on the molybdenum oxide thin film by codepositing the compound (a p-type semiconductor compound) according to Synthesis Example 1 and $C_{60}$ (an n-type semiconductor compound) in a thickness ratio of 1:1. Then, an 80 nm-thick cathode is formed on the active layer by sputtering ITO, manufacturing an organic photoelectronic device.

Example 2

An organic photoelectronic device is manufactured according to the same method as Example 1, except for using the compound according to Synthesis Example 2 instead of the compound according to Synthesis Example 1.

Example 3

An organic photoelectronic device is manufactured according to the same method as Example 1, except for using the compound according to Synthesis Example 3 instead of the compound according to Synthesis Example 1.

Example 4

An organic photoelectronic device is manufactured according to the same method as Example 1, except for using the compound according to Synthesis Example 4 instead of the compound according to Synthesis Example 1.

Example 5

An organic photoelectronic device is manufactured according to the same method as Example 1, except for using the compound according to Synthesis Example 5 instead of the compound according to Synthesis Example 1.

Example 6

An organic photoelectronic device is manufactured according to the same method as Example 1, except for using the compound according to Synthesis Example 6 instead of the compound according to Synthesis Example 1.

Example 7

An organic photoelectronic device is manufactured according to the same method as Example 1, except for using the compound according to Synthesis Example 7 instead of the compound according to Synthesis Example 1.

Example 8

An organic photoelectronic device is manufactured according to the same method as Example 1, except for using the compound according to Synthesis Example 8 instead of the compound according to Synthesis Example 1.

Example 9

An organic photoelectronic device is manufactured according to the same method as Example 1, except for using the compound according to Synthesis Example 9 instead of the compound according to Synthesis Example 1.

Comparative Example 1

An organic photoelectronic device is manufactured according to the same method as Example 1, except for using the compound according to Comparative Synthesis Example 1 instead of the compound according to Synthesis Example 1.

Comparative Example 2

An organic photoelectronic device is manufactured according to the same method as Example 1, except for using the compound according to Comparative Synthesis Example 2 instead of the compound according to Synthesis Example 1.

Comparative Example 3

An organic photoelectronic device is manufactured according to the same method as Example 1, except for using the compound according to Comparative Synthesis Example 3 instead of the compound according to Synthesis Example 1.

Evaluation II

Image sensors including the organic photoelectronic devices according Examples 1 to 9 and Comparative Examples 1 to 3 are designed to evaluate crosstalk of the image sensors.

The crosstalk evaluation is performed as follows.

Each compound according to according to Synthesis Example 1 to 9 and Comparative Synthesis Examples 1 to 3, and $C_{60}$, in a ratio of 1:1, are respectively formed as a layer, and n and k are obtained by using spectroscopic ellipsometry. The n and k values and photoelectronic conversion efficiency of a silicon photodiode and an organic photoelectronic device are used to obtain spectrum sensitivity of red, green, and blue elements having a structure shown in FIGS. 3 and 4 by using an FDTD (finite difference time domain). Herein, a wavelength region is divided into three regions of 440-480 nm (blue), 520-560 nm (green), and 590-630 nm (red), and how much the other two optical conversion elements interfere with each particular region is evaluated. In other words, when an integral of a sensitivity curve of a blue element in the 440-480 nm is regarded as 100, a relative integral of sensitivity curves of red and green elements in the 440-480 nm is obtained. This value is crosstalk of the red and green elements regarding the blue region in the 440-480 nm range. The same process is performed regarding the 520-560 nm range and the 590-630 nm range to obtain each crosstalk therein. Lastly, the 6 values are averaged to obtain all crosstalk.

The results are provided in Table 2.

TABLE 2

|  | Average crosstalk (%) |
| --- | --- |
| Example 1 | 22.0 |
| Example 2 | 27.8 |
| Example 3 | 28.2 |
| Example 4 | 27.8 |
| Example 5 | 29.1 |
| Example 6 | 27.4 |
| Example 7 | 29.1 |
| Example 8 | 21.2 |
| Example 9 | 28.2 |
| Comparative Example 1 | 35.7 |
| Comparative Example 2 | 36.5 |
| Comparative Example 3 | 33.2 |

In Table 2, the crosstalk in each pixel indicates a ratio of unnecessarily inflowing light other than light of a particular wavelength region into each pixel when light in the wavelength regions of 590-630 nm, 520-560 nm, and 440-480 nm inflow 100% into the red pixel (R), green pixel (G), and blue pixel (B), and the average crosstalk may be defined as an average of a ratio of unnecessarily inflowing light into the red pixel (R) other than light of a red wavelength region, a ratio of unnecessarily inflowing light into the green pixel (G) other than light of a green wavelength region, and a ratio of unnecessarily inflowing light into the blue pixel (B)) other than light of a blue wavelength region.

Referring to Table 2, the image sensors including the organic photoelectronic device according to Examples 1 to 9 show remarkably decreased average crosstalk compared with the image sensors including the organic photoelectronic devices according to Comparative Examples 1 to 3. Specifically, the image sensors including the organic photoelectronic devices according to Examples 1 to 9 show average crosstalk of less than or equal to about 30%, while the image sensors including the organic photoelectronic devices according to Comparative Examples 1 to 3 show average crosstalk of greater than or equal to about 33%.

Figure 9:
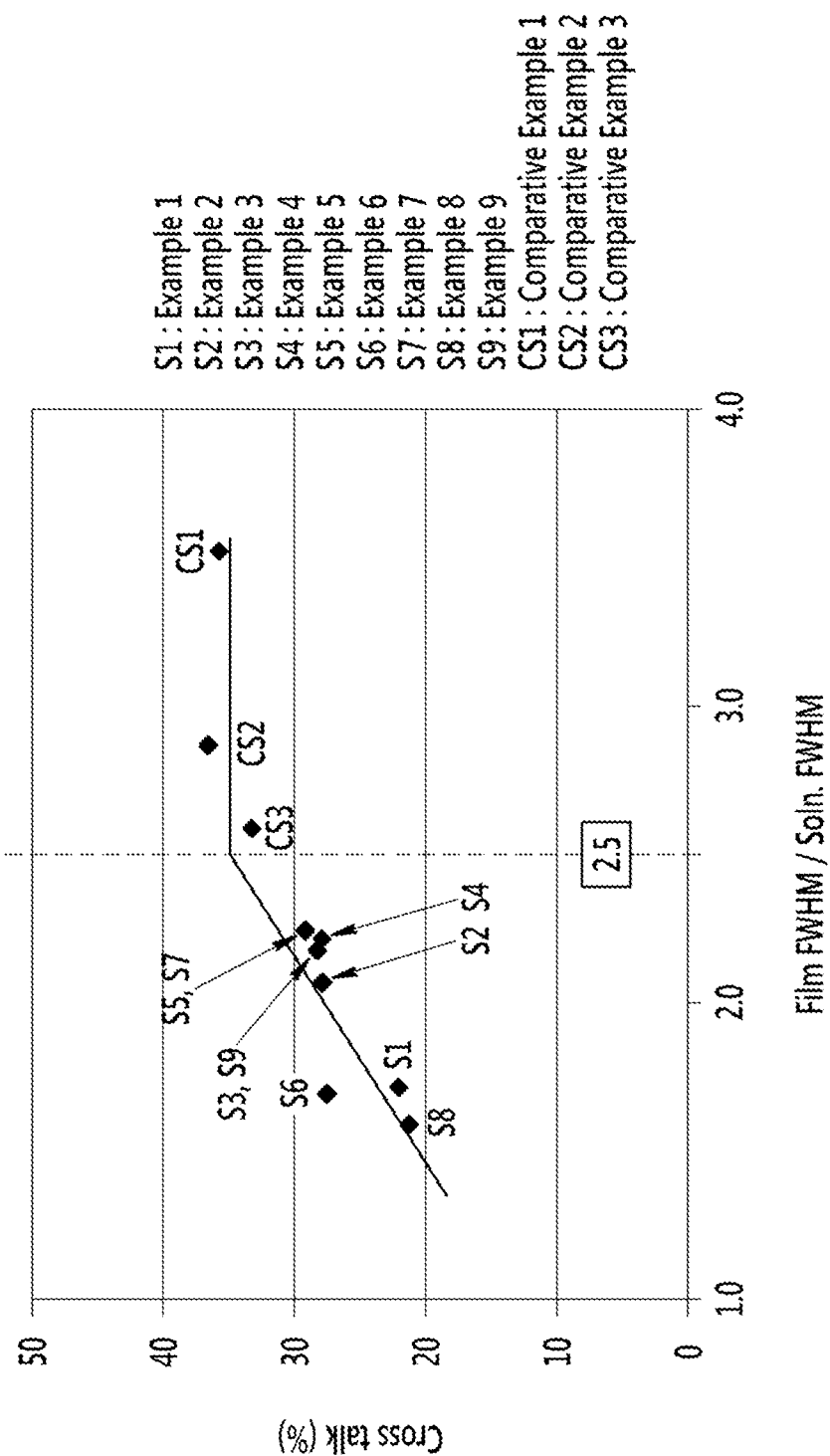
FIG. 9 is a graph showing a relationship between a FWHM and crosstalk of the image sensors including the organic photoelectronic devices according to Examples 1 to 9 and Comparative Examples 1 to 3.

FIG. 9 is a graph showing a relationship between a FWHM and crosstalk of the image sensors including the organic photoelectronic devices according to Examples 1 to 9 and Comparative Examples 1 to 3.

Referring to FIG. 9, the image sensors including the organic photoelectronic devices according to Examples 1 to 9, that is, using the compounds having a ratio of less than 2.5 between FWHMs in a solution state and in a thin film state, show average crosstalk of less than or equal to about 30%, while the image sensors including the organic photoelectronic devices according to Comparative Examples 1 to 3, that is, using the compounds having a ratio of greater than about 2.5 between FWHMs in a solution state and in a thin film state, show average crosstalk of greater than or equal to about 33%. From the results, a relationship between a ratio of FWHMs in a solution state and in a thin film state of the compounds used in the active layer, and crosstalk of an image sensor, may be confirmed.

Referring to the examples and comparative examples, when the subphthalocyanine derivatives according to the examples are used as a material for the organic photoelectronic conversion device, an absorption spectrum difference between solution state and vacuum-deposited thin film state is small (an FWHM ratio of less than or equal to 2.5), and crosstalk of less than or equal to 30 may be realized, when a green organic photoelectronic conversion film is stacked on a red and blue Si photoelectronic conversion device in an image sensor, which is usefully used. On the contrary, a material, for example, a conventional subphthalocyanine chloride, has relatively large crosstalk, so color separation in an image sensor is difficult and thus interference between pixels becomes larger and performance may be degraded. Accordingly, when the subphthalocyanine derivative having an FWHM ratio of less than or equal to 2.5 is used for a green absorption photoelectronic conversion device, a relatively high performance image sensor may be realized.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:
1. An organic photoelectronic device, comprising:
a first electrode and a second electrode facing each other; and
an active layer between the first electrode and the second electrode, the active layer including a first compound represented by the following Chemical Formula 1 or 2:

[Chemical Formula 1]

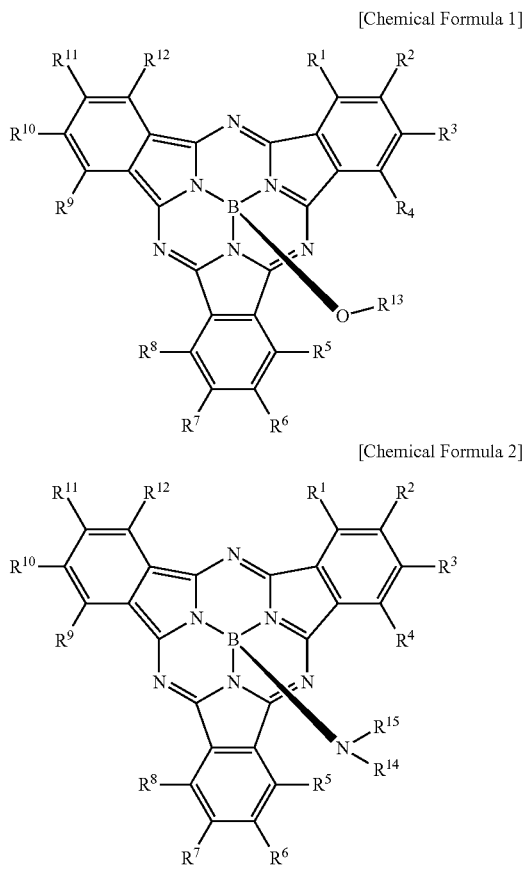

[Chemical Formula 2]

wherein, in the Chemical Formula 1 and 2,
each of $R^1$ to $R^{12}$ are independently one of hydrogen and a monovalent organic group,
$R^1$ to $R^{12}$ are independently present or are fused to each other to provide a ring,
$R^{13}$ is one of a substituted or unsubstituted $C_6$ to $C_{30}$ aryl group, a substituted or unsubstituted $C_3$ to $C_{30}$ heteroaryl group, a substituted or unsubstituted silyl group, and a combination thereof, and
each of $R^{14}$ and $R^{15}$ are independently one of a substituted or unsubstituted $C_6$ to $C_{30}$ aryl group, a substituted or unsubstituted $C_3$ to $C_{30}$ heteroaryl group, and a combination thereof, and
a ratio between a full width at half maximum (FWHM) of a light absorption curve depending on a wavelength of the first compound in a solution state and in a thin film state satisfies the following Relationship Equation 1:

FWHM2/FWHM1<2.5         [Relationship Equation 1]

wherein, in the Relationship Equation 1,
FWHM1 is the FWHM of the light absorption curve depending on the wavelength in the solution state, and
FWHM2 is the FWHM of the light absorption curve depending on the wavelength in the thin film state.

2. The organic photoelectronic device of claim 1, wherein the first compound selectively absorbs light in a green wavelength region.

3. The organic photoelectronic device of claim 1, wherein the FWHM of the light absorption curve of the first compound depending on the wavelength in the thin film state is less than or equal to about 70 nm.

4. The organic photoelectronic device of claim 3, wherein the FWHM of the light absorption curve of the first compound depending on the wavelength in the thin film state is about 30 nm to about 70 nm.

5. The organic photoelectronic device of claim 1, wherein the first compound is present in an amorphous state in the active layer.

6. The organic photoelectronic device of claim 1, wherein each of the $R^1$ to $R^{12}$ of the Chemical Formula 1 or 2 are independently one of hydrogen, a substituted or unsubstituted $C_1$ to $C_{30}$ aliphatic hydrocarbon group, a substituted or unsubstituted $C_6$ to $C_{30}$ aromatic hydrocarbon group, a substituted or unsubstituted $C_1$ to $C_{30}$ aliphatic heterocyclic group, a substituted or unsubstituted $C_2$ to $C_{30}$ aromatic heterocyclic group, a substituted or unsubstituted $C_1$ to $C_{30}$ alkoxy group, a substituted or unsubstituted $C_1$ to $C_{30}$ aryloxy group, a thio group, an alkylthio group, an arylthio group, a cyano group, a cyano-containing group, a halogen, a halogen-containing group, a substituted or unsubstituted sulfonyl group, a substituted or unsubstituted aminosulfonyl group, a substituted or unsubstituted arylsulfonyl group, and a combination thereof,
the $R^{13}$ of the Chemical Formula 1 is one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, a silyl group substituted with an alkyl group, a silyl group substituted with an aryl group, and a combination thereof, and
each of the $R^{14}$ and $R^{15}$ of the above Chemical Formula 2 are independently one of a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted quinolinyl group, and a combination thereof.

7. The organic photoelectronic device of claim 1, wherein the active layer further comprises a second compound being capable of absorbing light in a visible ray region.

8. The organic photoelectronic device of claim 7, wherein the second compound includes one of fullerene and a fullerene derivative.

9. The organic photoelectronic device of claim 7, wherein the second compound includes one of thiophene and a thiophene derivative.

10. The organic photoelectronic device of claim 1, wherein the first electrode and the second electrode are light-transmitting electrodes.

11. An image sensor comprising the organic photoelectronic device of claim 1.

12. The image sensor of claim 11, further comprising:
a semiconductor substrate integrated with a plurality of first photo-sensing devices sensing light in a blue wavelength region and a plurality of second photo-sensing devices sensing light in a red wavelength region, wherein the organic photoelectronic device is on the semiconductor substrate and selectively absorbs light in a green wavelength region.

13. The image sensor of claim 12, wherein the plurality of first photo-sensing devices and the plurality of second photo-sensing devices are stacked in a vertical direction on the semiconductor substrate.

14. The image sensor of claim 12, further comprising:
a color filter layer between the semiconductor substrate and the organic photoelectronic device, the color filter layer including a blue filter selectively absorbing light in a blue wavelength region and a red filter selectively absorbing light in a red wavelength region.

15. The image sensor of claim 12, wherein the organic photoelectronic device selectively absorbing light in the green wavelength region, a blue photoelectronic device selectively absorbing light in a blue wavelength region, and a red photoelectronic device selectively absorbing light in a red wavelength region are stacked.

16. The image sensor of claim 11, wherein the image sensor has an average crosstalk value of less than or equal to about 30%.

17. An electronic device comprising the image sensor of claim 11.

* * * * *